United States Patent [19]
Xia et al.

[11] Patent Number: 5,862,057
[45] Date of Patent: Jan. 19, 1999

[54] METHOD AND APPARATUS FOR TUNING A PROCESS RECIPE TO TARGET DOPANT CONCENTRATIONS IN A DOPED LAYER

[75] Inventors: Li-Qun Xia, Santa Clara; Ellie Yieh, Millbrae, both of Calif.

[73] Assignee: Applied Materials, Inc., Santa Clara, Calif.

[21] Appl. No.: 709,436

[22] Filed: Sep. 6, 1996

[51] Int. Cl.$^6$ .................................................. G06F 17/00
[52] U.S. Cl. ...................... 364/488; 364/489; 364/490; 438/646
[58] Field of Search .................................. 364/488–491; 438/646; 437/236, 237, 238, 235; 427/569

[56] References Cited

U.S. PATENT DOCUMENTS

| | | | |
|---|---|---|---|
| 4,791,296 | 12/1988 | Carpio ................................. | 250/339.08 |
| 5,028,566 | 7/1991 | Lagendijk ............................... | 438/784 |
| 5,149,612 | 9/1992 | Langlois et al. ......................... | 430/132 |
| 5,324,684 | 6/1994 | Kermani et al. ......................... | 438/656 |
| 5,356,722 | 10/1994 | Nguyen et al. .......................... | 427/569 |
| 5,425,812 | 6/1995 | Tsutahara et al. ....................... | 118/725 |
| 5,656,556 | 8/1997 | Yang ..................................... | 438/646 |

OTHER PUBLICATIONS

Favreau et al "Step Coverage Study of Peteos Deposition Fro Intermetal Dielectric Applications, " IEEE, pp. 166–170, Jun. 1990.

Zhu et al "Profile Control in Isotropic Plasma Etching, " IEEE, pp. 116–119, Oct. 1992.

Allman et al "Effects of PECVD Oxide Process in the Sandwitched SOG Structure on MOSFET Hot–Carrier Reliability, " IEEE, pp. 173–175, Jun. 1995.

Pennington et al. "A Low–Temperature In–Situ Deposition and Planarizing Phoshosilicate Glass Process for Filling High–Aspect–Ratio Topography, " IEEE, pp. 71–75, Jun. 1990.

Crouch et al. "Optimal Control Processing to Increase Single Wafer Reactor Throughput in LPCVD, " IEEE, pp. 233–238, Sep. 1995.

*Primary Examiner*—Kevin J. Teska
*Assistant Examiner*—Vuthe Siek
*Attorney, Agent, or Firm*—Townsend and Townsend and Crew

[57] ABSTRACT

A method and apparatus for tuning a process recipe to target specific dopant concentrations in a doped layer. The present invention controls the process tuning based on predetermined and easily updatable trend curves for that process. The present invention simplifies the tuning process, shortens the time required to tune the process recipe, and is independent of any personal experience, thereby reducing reliance on the variable skills and experience level of any individual equipment support engineer. The present invention uses a computer program based on process characterization to replace the traditional manual tuning approach. Further, the present invention iteratively corrects for process drift and makes possible efficient tuning of dopant concentration levels in the deposited doped film. Other embodiments of the present method and apparatus provide for storage of the tuning history so as to allow incorporation of the history in order to account for the dopant flow drift. Accordingly, the process characterization may be eliminated for a different individual deposition system. The present invention minimizes the number of trials needed before attaining a doped film with the desired dopant concentrations. Additionally, training of equipment support engineers to perform process tuning is made simpler.

24 Claims, 9 Drawing Sheets

METHOD AND APPARATUS FOR TUNING A PROCESS RECIPE TO TARGET DOPANT CONCENTRATIONS IN A DOPED LAYER

BACKGROUND OF THE INVENTION

The present invention relates to the processing of substrates. More particularly, the present invention relates to an improved method and apparatus for tuning a process recipe to target dopant concentrations in a doped layer formed over a semiconductor substrate. According to a specific embodiment, the present invention may be used to tune a borophosphosilicate glass (BPSG) recipe to target dopant concentrations in a deposited BPSG layer. Of course, the present invention may also be applied to the formation of other doped layers.

One of the primary steps in the fabrication of modern semiconductor devices is the formation of a doped layer on a semiconductor substrate. A doped dielectric layer can be deposited by chemical vapor deposition (CVD). Conventional thermal CVD processes supply reactive gases to the substrate surface where heat-induced chemical reactions take place to produce a desired film. Plasma-enhanced CVD (PECVD) processes promote excitation and/or disassociation of the reactant gases by the application of radio frequency (RF) energy to a reaction zone near the substrate surface, thereby creating a plasma to produce the desired film.

Semiconductor integrated circuits currently being manufactured follow ultra high density (e.g., about 0.5 to 0.35 micron) design rules, and circuits manufactured in the near future will follow even smaller design rules. As device sizes become smaller and integration density increases, issues which were not previously considered important by the industry are becoming of increasing concern. For example, consistently and reliably forming doped dielectric films, such as BPSG films, having specific target dopant concentrations is often important for applications requiring certain film properties that may be influenced by the dopant concentration levels.

In order to deposit doped films having specific target dopant concentrations in a consistent manner, the industry has traditionally resorted to the method of manually tuning the process recipe using a trial and error approach. First, initial process gas flow rates are set and a predetermined thickness of the desired doped film is deposited on a wafer. Then, the deposited doped film is tested to determine the dopant concentration levels resulting from deposition using the initial process gas flow rates. If the measured dopant concentration levels are not the desired target dopant concentrations, the equipment support engineer adjusts the process gas flow rates based on her/his personal experience with the performance of this specific system in the previous trial deposition. After the predetermined thickness of the doped film is deposited on a wafer using the adjusted flow rates, the dopant concentration levels are measured again. Depending on the empirical results from prior trial depositions for this specific system, the equipment support engineer may repeatedly engage in this iterative, trial and error approach. This manual tuning procedure is often very rough and may take several hours before resulting in a somewhat more refined tuning.

The manual tuning process is labor intensive, complicated, and often very time consuming, taking at least several hours and often up to an entire day, before resulting in the targeted dopant concentration levels. Also, the total time to tune the process using the trial-and-error approach often depends on the skills and experience of the individual equipment support engineer. Excessive time spent on manually tuning the process translates to an inefficient use of process time for the customer or user of the deposition system. Further, it is often time consuming, inefficient, and difficult to train an equipment support engineer (or other person) to tune a process sufficiently well. Another difficulty is that the results of identical tuning procedures of the same process recipe may vary in different deposition systems depending on the individual deposition chamber in use. Therefore, the manual tuning process must be individualized to the extent possible for the deposition chamber used. In addition, the speed at which the process tuning may be completed depends on how close the initial process flow rates used are to the actual process flow rates required to reach the targeted dopant concentration levels. The initial process flow rates used to try to reach target dopant concentration levels are based on trend curves, which may deviate from the actual system behavior.

From the above, it can be seen that it is desirable to have a method and apparatus for forming doped films with targeted dopant concentrations in a consistent, reliable, and efficient manner without regard to either the individual chamber differences or the individual tuner's skills and experience level.

SUMMARY OF THE INVENTION

The present invention provides a method and apparatus for tuning a process for forming a doped layer with targeted specific dopant concentrations. The present invention controls the process tuning based on predetermined and easily updatable trend curves for that process. The present invention simplifies the tuning process and shortens the time required to tune the process recipe. Also, the present invention is independent of any personal experience, thereby reducing reliance on the variable skills and experience level of any individual equipment support engineer. The present invention uses a computer program based on process characterization to replace the traditional manual tuning approach. Further, the present invention iteratively corrects for process drift and makes possible efficient tuning of dopant concentration levels in the deposited doped film. Other embodiments of the present method and apparatus provide for storage of the tuning history so that the history can be used to account for the dopant flow drift. Accordingly, the process characterization may be eliminated for a different individual deposition system. The present invention minimizes the number of trials needed before attaining a doped film with the desired dopant concentrations. In addition, training of equipment support engineers to perform process tuning is simpler.

These and other embodiments of the present invention, as well as its advantages and features, are described in more detail in conjunction with the text below and attached figures.

DETAILED DESCRIPTION OF THE SPECIFIC EMBODIMENTS

I. Exemplary CVD System

Figure 1A:
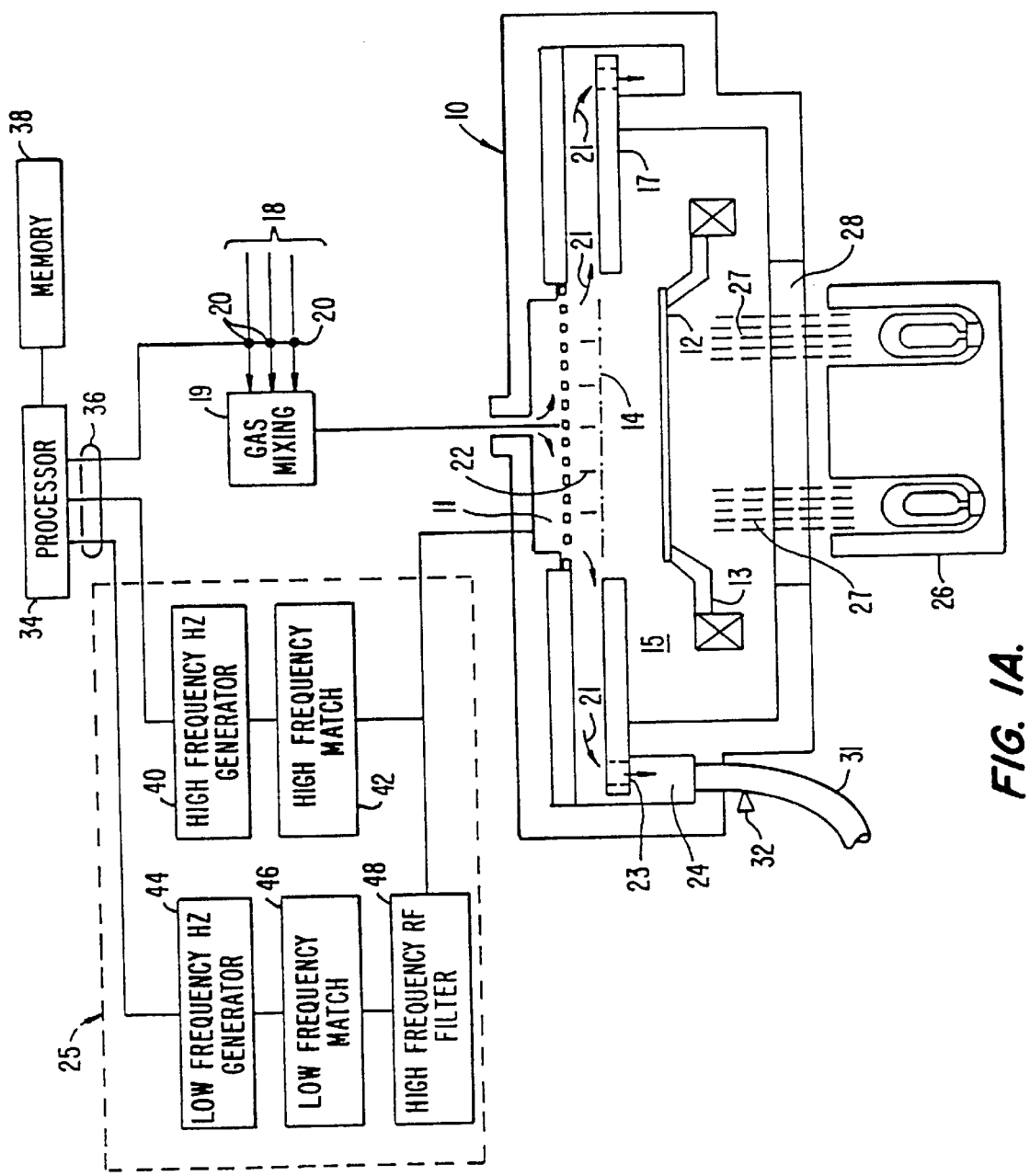
FIG. 1A is a vertical, cross-sectional view of one embodiment of a simplified chemical vapor deposition system according to the present invention.

The method of the present invention for tuning a process for forming a doped layer, including for example BPSG, can be used in a variety of different chemical vapor deposition (CVD) processing machines. One suitable CVD machine in which the method of the present invention can be carried out is shown in FIG. 1, which is a vertical, cross-sectional view of one embodiment of a simplified, parallel plate CVD system 10 having a vacuum chamber 15. Of course, in an open atmospheric system such as atmospheric pressure CVD (APCVD), chamber 15 is a non-vacuum chamber having an exhaust without a vacuum pump system. CVD system 10 contains a gas distribution manifold 11 for dispersing process gases through perforated holes in manifold 11 to a wafer (not shown) that rests on a susceptor 12. Susceptor 12 is highly thermally responsive and is mounted on supports 13 so that susceptor 12 (and the wafer supported on the upper surface of susceptor 12) can be controllably moved between a lower loading/off-loading position and an upper processing position 14 which is closely adjacent to manifold 11. A center board (not shown) includes sensors for providing information on the position of the wafer.

When susceptor 12 and the wafer are in processing position 14, they are surrounded by a baffle plate 17 having a plurality of spaced holes 23 which exhaust into an annular vacuum manifold 24. Deposition and carrier gases are supplied through supply lines 18 into a mixing system 19 where they are combined and then sent to manifold 11. Generally, supply lines 18 for each of the process gases include (i) safety shut-off valves (not shown) that can be used to automatically or manually shut off the flow of process gas into the chamber, and (ii) mass flow controllers 20 that measure the flow of gas or liquid through the supply lines. When toxic gases are used in the process, the several safety shut-off valves are positioned on each gas supply line in conventional configurations. The rate at which deposition and carrier gases are supplied to gas mixing system 19 is controlled by liquid or gas mass flow controllers 20 and/or by valves. During processing, gas supplied to manifold 11 is vented toward the wafer surface and is uniformly distributed radially across the wafer surface in a laminar flow as indicated by arrows 21. An exhaust system then exhausts the gas (as indicated by arrows 22) via ports 23 into the circular vacuum manifold 24 and out an exhaust line 31 by a vacuum pump system (not shown). The rate at which gases are released through exhaust line 31 is controlled by a throttle valve 32.

The deposition process performed in CVD system 10 can be either a thermal process or a plasma-enhanced process. In a plasma process, a controlled plasma is formed adjacent to the wafer by RF energy applied to manifold 11 from RF power supply 25. Manifold 11 is also an RF electrode, while susceptor 12 is grounded. RF power supply 25 can supply either single or mixed frequency RF power (or other desired variations) to manifold 11 to enhance the decomposition of reactive species introduced into chamber 15. The mixed frequency RF power is generated by a high frequency RF generator 40 and corresponding match circuit 42 and by a low frequency RF generator 44 and corresponding match circuit 46. A high frequency filter 48 prevents voltage generated by high frequency generator 40 from damaging the low frequency generator.

Heat is distributed by an external lamp module 26. External lamp heater module 26 provides a collimated annular pattern of light 27 through a quartz window 28 onto an annular outer peripheral portion of susceptor 12. Such heat distribution compensates for the natural heat loss pattern of the susceptor and provides uniform, rapid thermal heating of the susceptor and wafer for effecting deposition.

Typically, any or all of the chamber lining, gas distribution manifold faceplate, supports 13, and various other reactor hardware is made out of material such as aluminum or anodized aluminum. An example of such a CVD apparatus is described in U.S. Pat. No. 5,000,113, which is incorporated herein by reference for all purposes, entitled "Thermal CVD/PECVD Reactor and Use for Thermal Chemical Vapor Deposition of Silicon Dioxide and In situ Multi-step Planarized Process," issued to Wang et al. and assigned to Applied Materials, Inc., the assignee of the present invention.

A robotized arm coupled to motors (not shown) raises and lowers susceptor 12 between a processing position 14 and a lower, wafer-loading position. Motors and optical sensors are used to move and determine the position of movable mechanical assemblies such as throttle valve 32 and susceptor 12. The heater, motors, valves or flow controllers 20 connected to supply lines 18, gas mixing system 19, throttle valve 32, RF power supply 25, and lamp magnet drivers are controlled by a processor 34 over control lines 36 of which only some are shown.

Processor 34 controls all of the activities of the CVD machine. Acting as the system controller, processor 34 executes system control software, which is a computer program stored in a memory 38 coupled to processor 34. Preferably, memory 38 may be a hard disk drive, but of course memory 38 may be other kinds of memory. In addition to a hard disk drive (e.g., memory 38), CVD system 10 in a preferred embodiment includes a floppy disk drive and a card rack. Processor 34 operates under the control of the system control software, which includes sets of instructions that dictate the timing, mixture of gases, chamber pressure, chamber temperature, RF power levels, susceptor position, and other parameters of a particular process. Other computer programs such as those stored on other memory including, for example, a floppy disk or other computer program product inserted in a disk drive or other appropriate drive, may also be used to operate processor 34. The card rack contains a single board computer, analog and digital input/output boards, interface boards and stepper motor controller boards. Various parts of CVD system 10 conform to the Versa Modular European (VME) standard which defines board, card cage, and connector dimensions and types. The VME standard also defines the bus structure having a 16-bit data bus and 24-bit address bus.

Figure 1B:
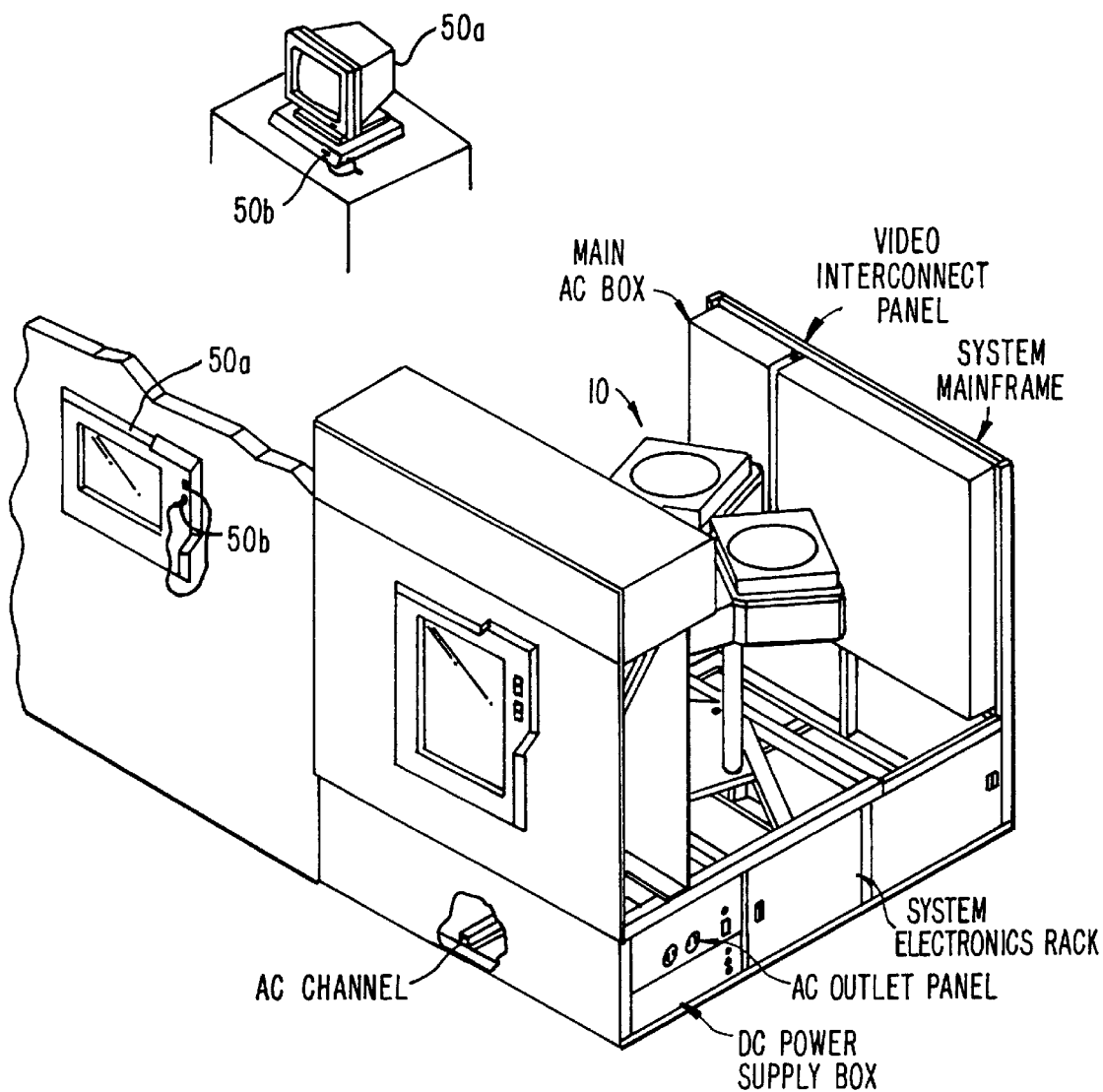
FIG. 1B is a simplified diagram of the system monitor and CVD system 10 in a multichamber system.

The interface between a user and processor 34 is via a CRT monitor 50a and lightpen 50b, shown in FIG. 1B which is a simplified diagram of the system monitor and CVD system 10 in a multichamber system, which may include one or more chambers. In the preferred embodiment two monitors 50a are used, one mounted in the clean room wall for the operators and the other behind the wall for the service technicians. Both monitors 50a simultaneously display the same information, but only one lightpen 50b is enabled. The lightpen 50b detects light emitted by CRT display with a light sensor in the tip of the pen. To select a particular screen or function, the operator touches a designated area of the display screen and pushes the button on the pen 50b. The touched area changes its highlighted color, or a new menu or screen is displayed, confirming communication between the lightpen and the display screen. Of course, other devices, such as a keyboard, mouse, or other pointing or communication device, may be used instead of or in addition to lightpen 50b to allow the user to communicate with processor 34.

The process for depositing the film can be implemented using a computer program product that is executed by processor 34. The computer program code can be written in any conventional computer readable programming language such as, for example, 68000 assembly language, C, C++, Pascal, Fortran, or other language. Suitable program code is entered into a single file, or multiple files, using a conventional text editor, and stored or embodied in a computer usable medium, such as a memory system of the computer. If the entered code text is in a high-level language, the code is compiled, and the resultant compiler code is then linked with an object code of precompiled Windows library routines. To execute the linked compiled object code, the system user invokes the object code, causing the computer system to load the code in memory, from which the CPU reads and executes the code to perform the tasks identified in the program.

Figure 1C:
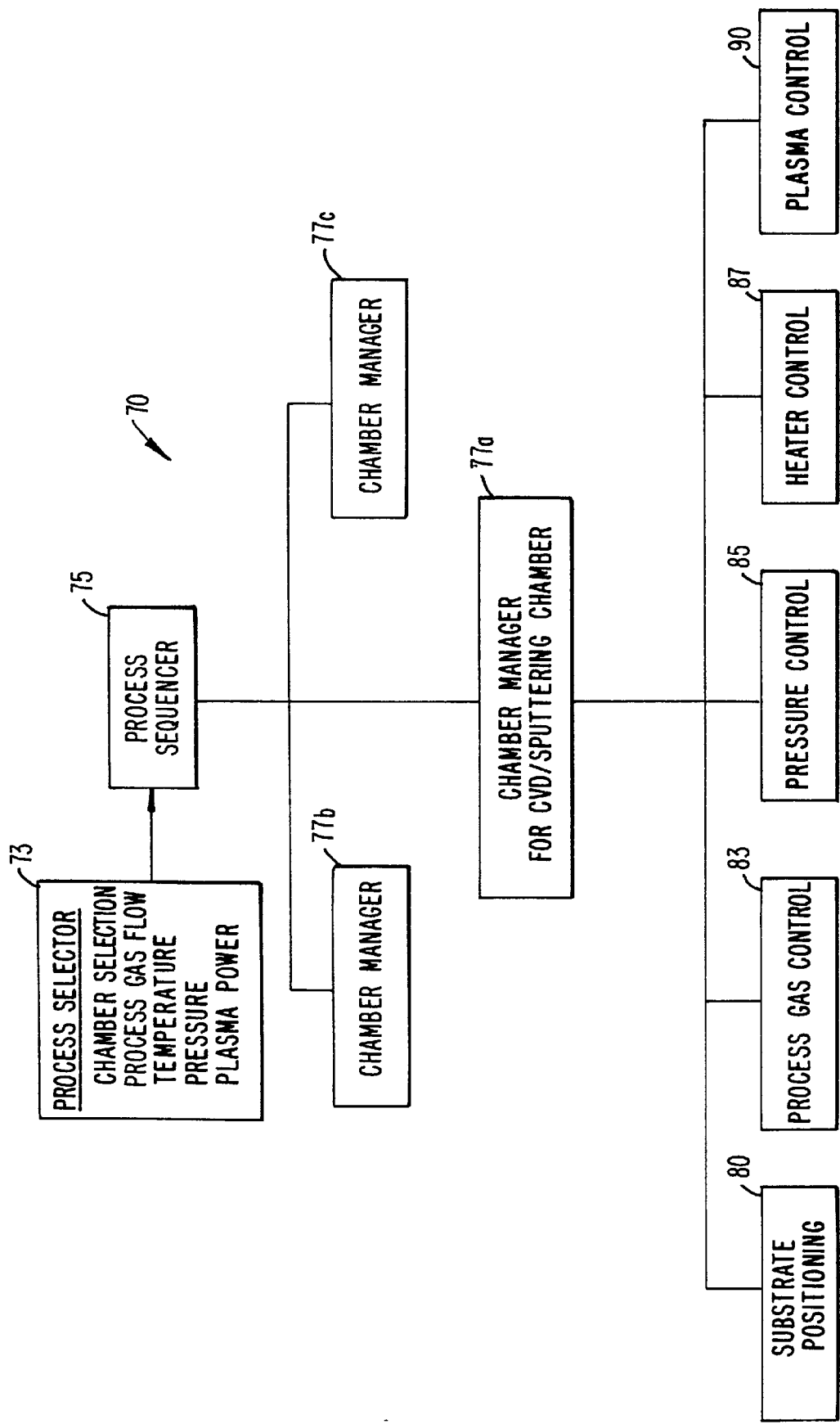
FIG. 1C is an illustrative block diagram of the hierarchical control structure of the system control software, computer program 70, according to a specific embodiment.

FIG. 1C is an illustrative block diagram of the hierarchical control structure of the system control software, computer program 70, according to a specific embodiment. Using a lightpen interface, a user enters a process set number and process chamber number into a process selector subroutine 73 in response to menus or screens displayed on the CRT monitor. The process sets, which are predetermined sets of process parameters necessary to carry out specified processes, are identified by predefined set numbers. Process selector subroutine 73 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as high and low frequency RF power levels and the low frequency RF frequency, cooling gas pressure, and chamber wall temperature. The process parameters are provided to the user in the form of a recipe and may be entered utilizing the lightpen/CRT monitor interface.

The signals for monitoring the process are provided by the analog input and digital input boards of the system controller, and the signals for controlling the process are output on the analog output and digital output boards of CVD system 10.

A process sequencer subroutine 75 comprises program code for accepting the identified process chamber and set of process parameters from process selector subroutine 73, and for controlling operation of the various process chambers. Multiple users can enter process set numbers and process chamber numbers, or a user can enter multiple process set numbers and process chamber numbers, so sequencer subroutine 75 operates to schedule the selected processes in the desired sequence. Preferably, sequencer subroutine 75 includes program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 can be designed to take into consideration the present condition of the process chamber being used in comparison with the desired process conditions for a selected process, or the "age" of each particular user-entered request, or any other relevant factor a system programmer desires to include for determining scheduling priorities.

Once sequencer subroutine 75 determines which process chamber and process set combination is going to be executed next, the sequencer subroutine 75 initiates execution of the process set by passing the particular process set parameters to a chamber manager subroutine 77a–c which controls multiple processing tasks in a process chamber 15 according to the process set determined by sequencer subroutine 75. For example, the chamber manager subroutine 77a comprises program code for controlling sputtering and CVD process operations in process chamber 15. Chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art would readily recognize that other chamber control subroutines can be included depending on what processes are to be performed in process chamber 15. In operation, chamber manager subroutine 77a selectively schedules or calls the process component subroutines in accordance with the particular process set being executed. Chamber manager subroutine 77a schedules the process component subroutines much like sequencer subroutine 75 schedules which process chamber 15 and process set are to be executed next. Typically, chamber manager subroutine 77a includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIG. 1C. Substrate positioning subroutine 80 comprises program code for controlling chamber components that are used to load the substrate onto susceptor 12 and, optionally, to lift the substrate to a desired height in chamber 15 to control the spacing between the substrate and the gas distribution manifold 11. When a substrate is loaded into process chamber 15, susceptor 12 is lowered to receive the substrate and then susceptor 12 is raised to the desired height. In operation, substrate positioning subroutine 80 controls movement of the susceptor in response to process set parameters related to the support height that are transferred from chamber manager subroutine 77a.

Process gas control subroutine 83 has program code for controlling process gas composition and flow rates. Process gas control subroutine 83 controls the open/close position of the safety shut-off valves, and also ramps up/down the mass flow controllers to obtain the desired gas flow rate. Process gas control subroutine 83 is invoked by the chamber manager subroutine 77a, as are all chamber component subroutines, and receives subroutine process parameters related to the desired gas flow rates from the chamber manager. Typically, process gas control subroutine 83 operates by opening the gas supply lines, and repeatedly (i) reading the necessary mass flow controllers, (ii) comparing the readings to the desired flow rates received from chamber manager subroutine 77a, and (iii) adjusting the flow rates of the gas supply lines as necessary. Furthermore, process gas control subroutine 83 includes steps for monitoring the gas flow rates for unsafe rates, and activating the safety shut-off valves when an unsafe condition is detected.

In some processes, an inert gas such as argon is flowed into chamber 15 to stabilize the pressure in the chamber before reactive process gases are introduced. For these processes, process gas control subroutine 83 is programmed to include steps for flowing the inert gas into chamber 15 for an amount of time necessary to stabilize the pressure in the chamber, and then the steps described above would be carried out. Additionally, when a process gas is to be vaporized from a liquid precursor, for example tetraethylorthosilane ("TEOS"), process gas control subroutine 83 would be written to include steps for bubbling a delivery gas such as helium through the liquid precursor in a bubbler assembly, or introducing a carrier gas such as helium to a liquid injection system. When a bubbler is used for this type of process, process gas control subroutine 83 regulates the flow of the delivery gas, the pressure in the bubbler, and the bubbler temperature in order to obtain the desired process gas flow rates. As discussed above, the desired process gas flow rates are transferred to process gas control subroutine 83 as process parameters. Furthermore, process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the aperture size of the throttle valve in the exhaust system of the chamber. The aperture size of the throttle valve is set to control the chamber pressure at a desired level in relation to the total process gas flow, the size of the process chamber, and the pumping setpoint pressure for the exhaust system. When pressure control subroutine 85 is invoked, the desired, or target, pressure level is received as a parameter from chamber manager subroutine 77a. The pressure control subroutine 85 measures the pressure in chamber 15 by reading one or more conventional pressure nanometers connected to the chamber, compares the measure value(s) to the target pressure, obtains PID (proportional, integral, and differential) values from a stored pressure table corresponding to the target pressure, and adjusts the throttle valve according to the PID values obtained from the pressure table. Alternatively, pressure control subroutine 85 can be written to open or close the throttle valve to a particular aperture size to regulate the pressure in chamber 15 to the desired level.

A heater control subroutine 87 comprises program code for controlling the temperature of the lamp module used to heat the substrate. Heater control subroutine 87 is also invoked by chamber manager subroutine 77a and receives a target, or setpoint, temperature parameter. Heater control subroutine 87 measures the temperature by measuring voltage output of a thermocouple located in susceptor 12, compares the measured temperature to the setpoint temperature, and increases or decreases current applied to lamp module 26 to obtain the setpoint temperature. The temperature is obtained from the measured voltage by looking up the corresponding temperature in a stored conversion table, or by calculating the temperature using a fourth-order polynomial. When radiant lamps are used to heat susceptor 12, heater control subroutine 87 gradually controls a ramp up/down of current applied to the lamp. The gradual ramp up/down increases the life and reliability of the lamp. Additionally, a built-in fail-safe mode can be included to detect process safety compliance, and can shut down operation of lamp module 26 if process chamber 15 is not properly set up.

A plasma control subroutine 90 comprises program code for setting the low and high frequency RF power levels applied to the process electrodes in chamber 15, and for setting the low frequency RF frequency employed. Like the previously described chamber component subroutines, plasma control subroutine 90 is invoked by chamber manager subroutine 77a.

The CVD system description presented above is mainly for illustrative purposes and should not be considered as limiting the scope of the present invention. The exemplary CVD system 10 is a single-wafer chamber system. However, other CVD systems that are multiple-wafer chamber systems may be used in other embodiments of the invention. Variations of the reactor described above, such as variations in platen or susceptor design, heater design, location of RF power connections, non-use of vacuum pumping system, and others are possible. For example, the wafer could be supported and heated by a resistively heated susceptor. Additionally, other CVD equipment such as electron cyclotron resonance (ECR) plasma CVD devices, inductively coupled RF high-density plasma CVD devices, or the like may be employed. The doped layer and method for tuning the process for forming such a layer should not be limited to any specific apparatus or to any specific process method or recipe.

II. Exemplary Recipe for Doped Dielectric Film Deposition

Figure 2:
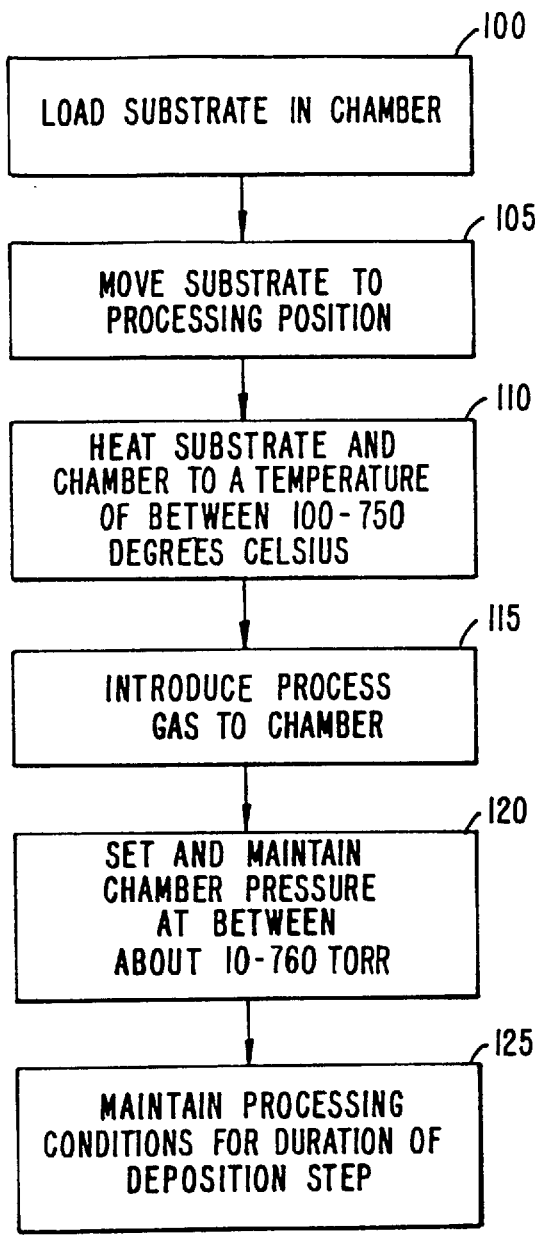
FIG. 2 is a simplified flowchart illustrating steps undertaken in formation of a doped layer in accordance with an embodiment of the present invention.

The method of the present invention is useful in the formation of doped layers according to any of several different process recipes. The usefulness of the method of the present invention is demonstrated for the formation of BPSG layers deposited with TEOS and ozone ("$O_3$") precursor gases, as an example. A process recipe of one such TEOS/$O_3$ BPSG film, using triethylborate ("TEB") as a boron source and triethylphosphate ("TEPO") as a phosphorus source, is set forth below as an example of a typical process recipe that may be tuned using the present invention. The steps involved in the formation of such a BPSG film are shown in the flowchart of FIG. 2 and discussed in detail below. For convenience and reference some of the steps discussed with respect to FIG. 2 include cross-reference numerals for the apparatus of FIG. 1. The exemplary process may be performed in CVD system 10, but those of ordinary skill in the art will understand that other process recipes and other reaction chamber types may also be used to deposit the doped dielectric film.

To form the BPSG layer, processor 34 controls the appropriate motors of the robotized arm to load a wafer to be processed in chamber 15 onto susceptor 12 through a vacuum-lock door and to move the wafer into processing position 14 (FIG. 2, steps 100 and 105). In processing position 14, the wafer is generally less than one centimeter from gas distribution manifold 11 to ensure a uniform film. Preferably, the wafer is positioned between about 150–400 mil from gas distribution manifold 11, and most preferably about 220 mil. Such spacing confines the reactant gases between the wafer and manifold, increasing reaction efficiency and deposition rate, and helping confine the deposition of material to the surface of the wafer. Prior to steps 100 and 105, the wafer may have been subjected to multiple processing steps to form active devices and other structures on the substrate surface.

Once the wafer is properly positioned, processor 34 controls heater 26 to heat the wafer and susceptor to a temperature of between about 100° and 750° C. (step 110). Preferably, the wafer and susceptor are heated to a temperature within a range of about 400°–500° C. and most preferably to about 480° C. These temperature ranges are maintained throughout the deposition. The reaction chamber is maintained at a pressure within a range of about 10–760 torr. Preferably, the pressure is maintained within a range of about 150–600 torr, and most preferably it is maintained at about 200 torr.

A process gas is then introduced into the chamber from manifold 11 (step 115). The process gas includes reactant gases containing phosphorus, boron, silicon and oxygen. The reactant gases, except ozone, are introduced through appropriate supply lines and mixed together in gas mixing system 19. Ozone is introduced into chamber 15 from a separate line (not shown), which has its own gas supply valve or flow controller 20. The rate at which each individual reactant gas is introduced into either gas mixing system 19 or chamber 15 is controlled by processor 34 through valves or flow controllers 20 of the gas distribution system. In the present process, a mixture comprising TEB as the boron source, TEPO as the phosphorus source, TEOS as the silicon source, and one or more gaseous oxygen sources (such as $O_2$ or $O_3$) is formed. The TEB, TEPO and TEOS are all liquid sources that may be vaporized by conventional boiler-type or bubbler-type hot boxes, and preferably by a liquid injection system. A liquid injection system provides direct control of the volume of reactant liquid, and thereby dopants, introduced into the gas mixing system. The vaporized gases are then mixed in the gas mixing system with a helium carrier gas before being delivered to the gas distribution manifold.

In the present example, the flow rate of TEB is preferably between about 150–200 milligrams per minute (mgm). The flow rate of TEPO is preferably between about 35–75 mgm. The TEOS flow rate is between about 300–700 mgm. Of course, the flow rates of the TEB and TEPO may be varied as desired for other dopant concentrations. The vaporized TEOS, TEB, and TEPO gases are then mixed with a carrier gas flowing at a rate between 2000–8000 standard cubic centimeters per minute (sccm) and preferably are flowing at a rate of about 6000 sccm. The present exemplary BPSG process may use nitrogen, helium, argon or the like as the carrier gas. Oxygen in the form of $O_3$ is introduced at a flow rate of between about 2000–5000 sccm and is introduced preferably at a flow rate of about 4000 sccm. The ozone mixture contains between about 5–12 weight percentage (wt %) oxygen.

Of course, it is recognized that other flow rates and other sources of boron, phosphorus, silicon, and oxygen also may be used. For example, phosphine ($PH_3$), triethylphosphite ($TEP_i$), trimethylphosphate (TMOP), trimethylphosphite ($TMP_i$) or similar compounds may be used as a phosphorus source; and diborane ($B_2H_6$), trimethylborate (TMB) or similar compounds may be used as a boron source. Also, other silicon and oxygen sources may be used. For example, silane ($SiH_4$) or other organic sources may be used as the source of silicon, and $O_2$ or nitrous oxide ($N_2O$) may be used as the oxygen source.

A selected pressure of between about 10–760 torr in the reaction chamber is set and maintained throughout deposition by throttle valve 32 in conjunction with the vacuum pump system and the introduction of the process gas (step 120). Throttle valve 32, the vacuum pump system and the introduction of the process gases are all controlled by processor 34 in setting and maintaining the selected pressure. Preferably, pressure in the chamber is set and maintained at a selected pressure of between about 150–250 torr. After being set, processing conditions are maintained by processor 34 for a selected time period (step 125) to deposit the BPSG film. The above-described gas flow, chamber pressure and temperature ranges provide for a BPSG film that is deposited at a rate of between about 3500–5500 Å/minute. The film has a boron concentration level between about 2–6 wt % and a phosphorus concentration level between about 2–9 wt %.

The parameters in the above processes should not be considered limiting to the claims. The actual values (temperature, pressure, gas flows, etc.) selected for a particular recipe will vary according to desired characteristics of the resulting film. For example, the deposition rate of the film can be increased by increasing TEOS flow, within the above ranges, or by decreasing pressure. Also, flow values mentioned above are for a 200 mm wafer chamber, but would differ depending on the type or size of chamber used. One of ordinary skill in the art may also use other chemicals, chamber parameters, and conditions to produce similar films while using the present invention. Of course, such films may be deposited by other known methods as understood by one of ordinary skill in the art.

III. Exemplary Structures

Figure 3:
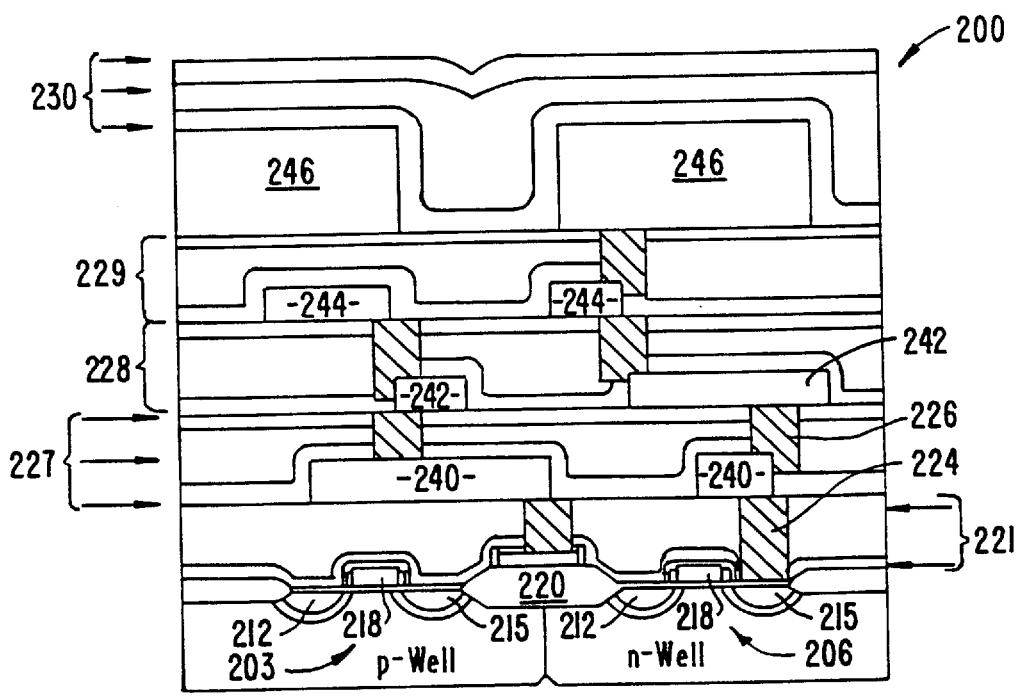
FIG. 3 is a simplified cross-sectional view of a semiconductor device manufactured according to the method of the present invention.

FIG. 3 illustrates a simplified cross-sectional view of an integrated circuit 200 which may utilize the doped film with targeted dopant concentrations, in accordance with the present invention. As shown, integrated circuit 200 includes NMOS and PMOS transistors 203 and 206. Each transistor 203 and 206 comprises a source region 212, a drain region 215 and a gate region 218. The transistors are electrically isolated from each other by field oxide region 220, formed by local oxidation of silicon (LOCOS) or other technique.

A premetal dielectric (PMD) layer 221 separates transistors 203 and 206 from metal layer 240 with connections between metal layer 240 and the transistors made by contacts 224. Metal layer 240 is one of four metal layers (240, 242, 244 and 246) included in integrated circuit 200. Each metal layer is separated from the other by respective intermetal dielectric layers 227, 228 and 229. Adjacent metal layers are connected at selected openings by vias 226. Deposited over metal layer 246 are planarized passivation layers 230.

It should be understood that simplified integrated circuit 200 is for illustrative purposes only. One of ordinary skill in the art would be able to implement the present method for fabrication of other integrated circuits such as microprocessors, application-specific integrated circuits (ASICS), memory devices, and the like.

IV. Exemplary Process Tuning Procedures for Specific Targeted Dopant Concentrations in the Doped Film Deposition The present invention efficiently tunes a process recipe of a doped film, such as BPSG, to target dopant concentrations, and utilizes trend curves based on knowledge of the characteristics of the process recipe used.

Actual process conditions used in the experiments were as follows. Specifically, the BPSG films were deposited at a susceptor temperature of about 480° C. and at a pressure of about 200 torr. Spacing between the susceptor and manifold was about 220 mil. The experiments were conducted in a lamp-heated DCVD Precision 5000 chamber (outfitted for 200 mm wafers) manufactured by Applied Materials, Inc. Gas flows in the experiments included introducing TEOS at a rate of about 500 mgm, introducing oxygen as O3 at a rate of about 4000 sccm, and introducing the helium carrier gas at a rate of about 6000 sccm. The ozone mixture contains about 12 wt % oxygen. Gas flows in the experiments also included introducing TEB into the chamber at rates of between about 150 and 250 mgm, and introducing TEPO at rates of between about 40 and 100 mgm. In the present experiments, the above process was used to deposit BPSG films of about 6000 Å as the standard thickness. Of course, other values may be selected as the standard thickness, with the following equations being changed appropriately. After the film was deposited, boron dopant concentration was measured using Fourier transform infrared (FTIR) spectroscopy, and phosphorus dopant concentration was measured using x-ray fluorescence (XRF), as are well known in the art.

Figure 4B:
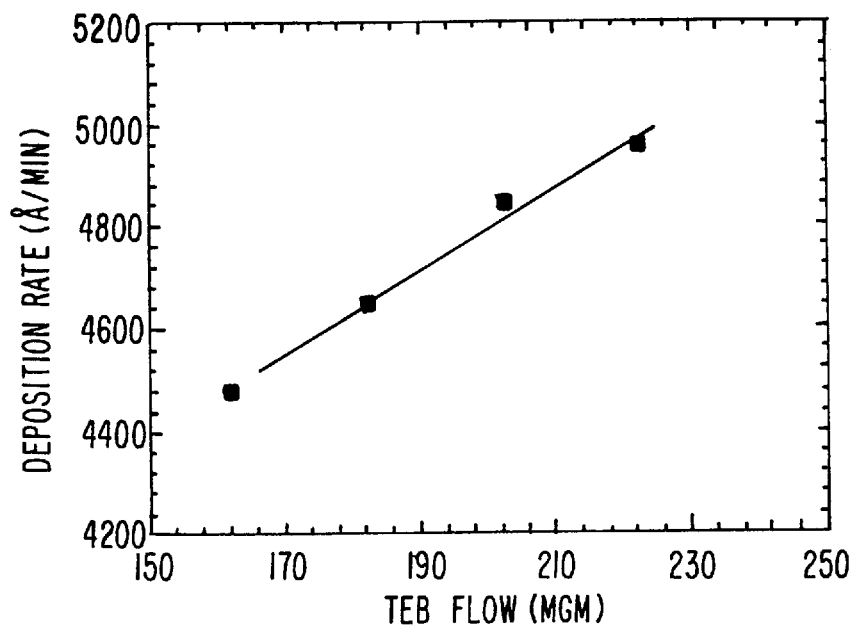
FIGS. 4(a) and 4(b) are graphs illustrating the effect of triethylborate ("TEB") flow on BPSG dopant concentration and deposition rate, respectively, in accordance with a specific embodiment.
Figure 4A:
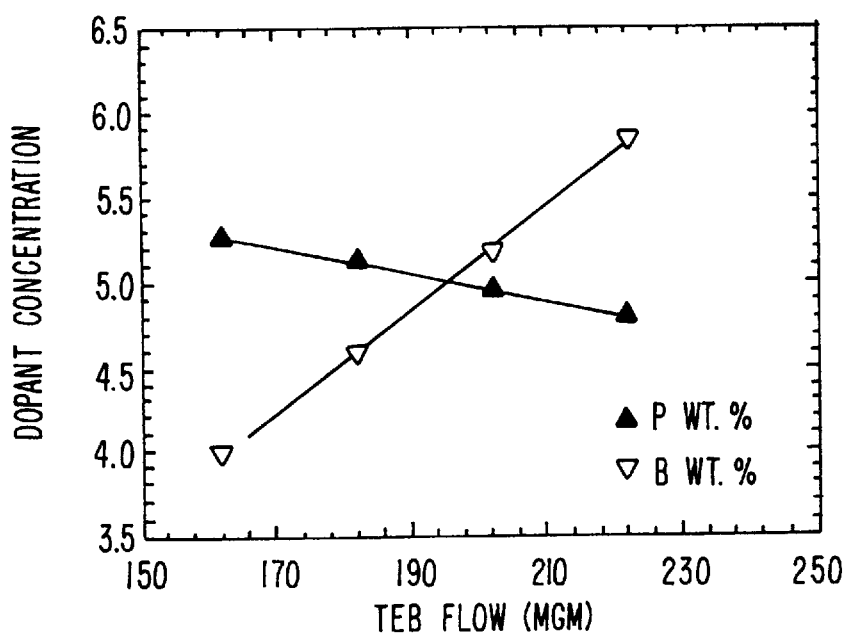
Figure 5A:
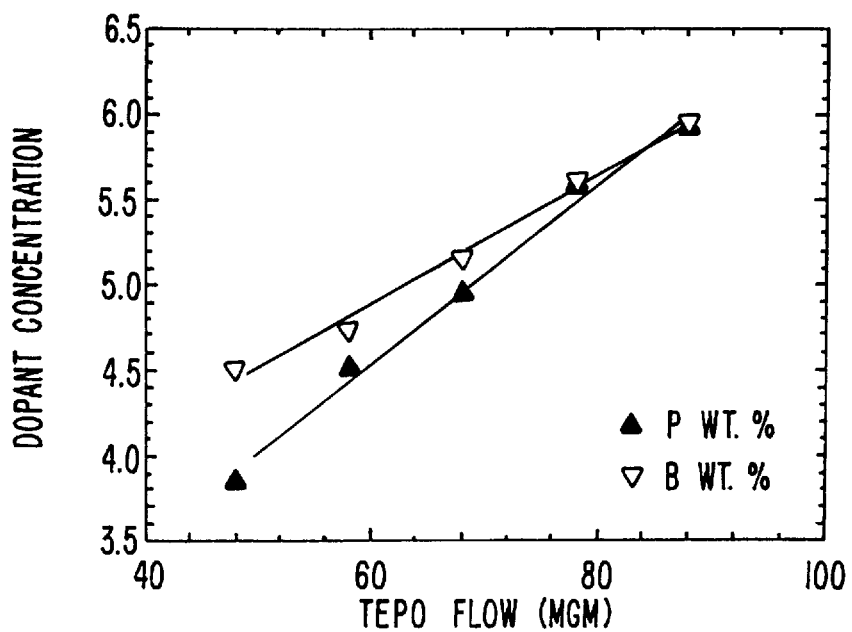
FIGS. 5(a) and 5(b) are graphs illustrating the effect of triethylphosphate ("TEPO") flow on BPSG dopant concentration and deposition rate, respectively, in accordance with a specific embodiment.
Figure 5B:
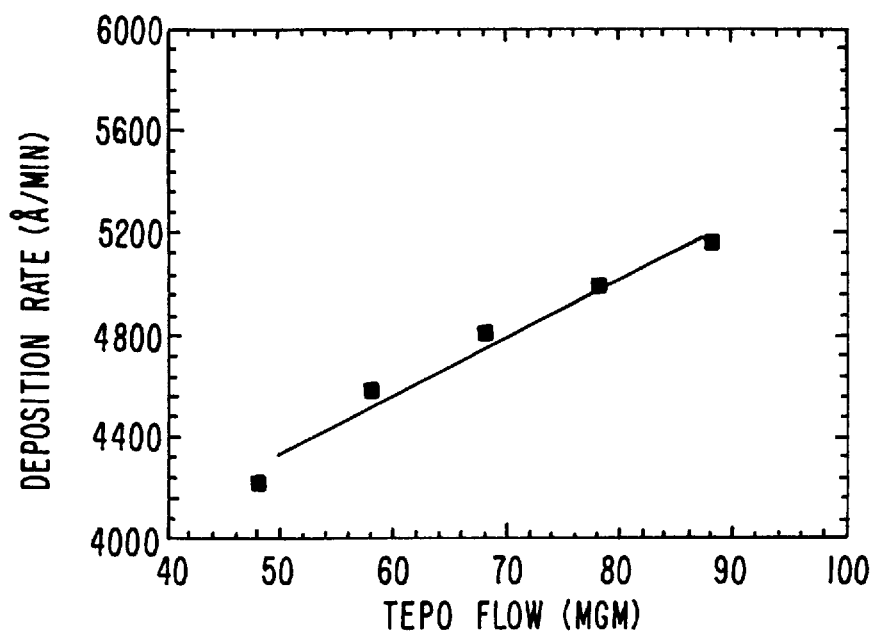

Trend curves based on the characteristics of the process recipe used in the present invention are shown in FIGS. 4(a)–4(b) and 5(a)–5(b). Experiments were conducted using the above process recipe with varying TEB flow or with varying TEPO flow. In particular, FIGS. 4(a) and 4(b) are graphs illustrating the effect of TEB flow on BPSG dopant concentrations and deposition rate, respectively, while keeping TEPO flow constant at about 69 mgm. FIGS. 5(a) and 5(b) are graphs illustrating the effect of TEPO flow on BPSG dopant concentrations and deposition rate, respectively, while keeping TEB flow constant at about 200 mgm. As illustrated by FIGS. 4(a) and 5(a), changing any single dopant flow, either TEPO or TEB flow, affects both the boron concentration and the phosphorus concentration in the deposited BPSG film. This is due to the competition between TEB and TEPO for silicon and oxygen atoms in the reaction. The BPSG films have a boron concentration level ranging between about 2–5 wt % and a phosphorus concentration level ranging between about 2–6 wt % for the ranges of flow shown. FIGS. 4(b) and 5(b) also show that changing any single dopant flow, either TEPO or TEB flow, affects the BPSG deposition rate, which ranges between about 2500–5500 Å/minute for the ranges of flow shown. Both the deposition rate and the dopant concentration levels are seen to be linearly dependent on the dopant flow. Specifically, FIGS. 4(a)–4(b) and 5(a)–5(b) show that the dependence of the deposition rate and dopant concentrations are linear to TEB flow at about 230 mgm and less, and linear to TEPO flow at about 90 mgm and less. The present embodiment of the invention assumes that the linear dependence is similar at all dopant concentrations. Accordingly, the present embodiment of the invention utilizes the linear characteristics of the process recipe used to tune the process for the deposited doped film with target dopant concentrations.

According to a specific embodiment of the present invention, a tuning computer program in Fortran programming language was developed to incorporate these linear relationships to adjust the dopant flow for the specific dopant concentration. More specifically, when provided with the initial dopant flow and concentrations, the program calculates the dopant flow and deposition time changes for the standard BPSG film thickness for the next trial. To account for any flow drift, the iterative method is adopted for fine tuning the process.

The use of the tuning computer program reduces the total time to tune the process and simplifies the training required to enable equipment support engineers to provide faster, and more efficient process tuning. The computer program may be stored on any tangible recording medium, such as a memory in the form of a floppy disk, hard disk, CD-ROM, storage tape, or the like. Accordingly, the computer program may be easily transported to and executed at the site of the deposition system in which a particular process is to be tuned to the customer's specified target dopant concentrations, which are input for use by the program. Also, data files for process characterization that are part of the computer program in some embodiments may also be stored on the recording medium. Of course, the tuning computer program may be incorporated into the system control software and stored on the system hard drive. In addition, the information on deposition time and dopant source flow rates that may be generated by the tuning program may be fed back automatically to processor 34 for automatic flow adjustments when in situ measurements of dopant concentrations may be made during deposition. Specific embodiments of the tuning computer program according to the present invention are discussed in detail below.

Based on the slopes of FIGS. 4(a)–4(b) and 5(a)–5(b), the following constants were defined:

$k_{11} = dDR/2dTEPO = 22.97$ Å/mg $k_{21} = dDR/2dTEB = 8.13$ Å/mg $k_{12} = dP/2dTEPO = 0.0526$ min/mg $k_{22} = dP/2dFEB = -0.0081$ min/mg $k_{13} = dB/2dTEPO = 0.0199$ min/mg $k_{23} = dB/2dTEB = 0.02237$ min/mg where "dDR" is the change in film deposition rate, "dTEPO" is the change in TEPO flow rate, "dTEB" is the change in TEB flow rate, "dP" is the change in the phosphorus concentration in the deposited films, and "dB" is the change in the boron concentration in the deposited films.

"$TEPO_0$" is the initial TEPO flow rate, "$TEB_0$" is the initial TEB flow rate, "$P_0$" is the initial phosphorus concentration in the film deposited with the initial TEPO and TEB flow rates, "$B_0$" is the initial boron concentration in the film deposited with the initial TEPO and TEB flow rates, and "$t_0$" is the time required to deposit the film with the initial TEPO and TEB flow rates to a standard thickness (e.g., 6000 Å). Similarly, "$TEPO_1$" is the final TEPO flow rate, "$TEB_1$" is the final TEB flow rate, "$P_1$" is the final phosphorus concentration in the film deposited with the final TEPO and TEB flow rates, "$B_1$" is the final boron concentration in the film deposited with the final TEPO and TEB flow rates, and "$t_1$" is the time required to deposit the film with the final TEPO and TEB flow rates to the standard thickness (e.g., 6000 Å). Because FTIR is sensitive to film thickness, a standard thickness must be deposited in order to measure the boron concentration. XRF, however, is not sensitive to film thickness. Of course, other processes may use other standard thicknesses, or may not need a standard thickness at all. The following equations (for the standard thickness of 6000 Å) were derived from the process characterization of FIGS. 4(a)–4(b) and 5(a)–5(b).

$$P_1-P_0=(TEPO_1-TEPO_0)*k_{12}+(TEB_1-TEB_0)*k_{22}$$

$$B_1-B_0=(TEPO_1-TEPO_0)*k_{13}+(TEB_1-TEB_0)*k_{23}$$

$$DR_1=6000/t_1=DR_0+(TEPO_1-TEPO_0)*k_{11}+(TEB_1-TEB_0)*k_{21}$$

$$=6000/t_0+(TEPO_1-TEPO_0)*k_{11}+(TEB_1-TEB_0)*k_{21}$$

Given the initial values and the desired target dopant concentrations, the computer program can calculate final values for the deposition time and for the TEPO and TEB flow rates using the following equations:

$$TEPO_1=TEPO_0+[(P_1-P_0)*k_{23}-(B_1-B_0)*k_{22}]/(k_{12}*k_{23}-k_{13}*k_{22})$$

$$TEB_1=TEB_0+[(B_1-B_0)*k_{12}-(P_1-P_0)*k_{13}]/(k_{12}*k_{23}-k_{13}*k_{22})$$

$$6000/t_1=6000/t_0+(TEPO_1-TEPO_0)*k_{11}+(TEB_1-TEB_0)*k_{21}$$

Of course, it is recognized that the values of the above constants may differ depending on the process recipe used and that the linear relationship and equations of the process characterization may be different for other doped deposited films.

Figure 6:
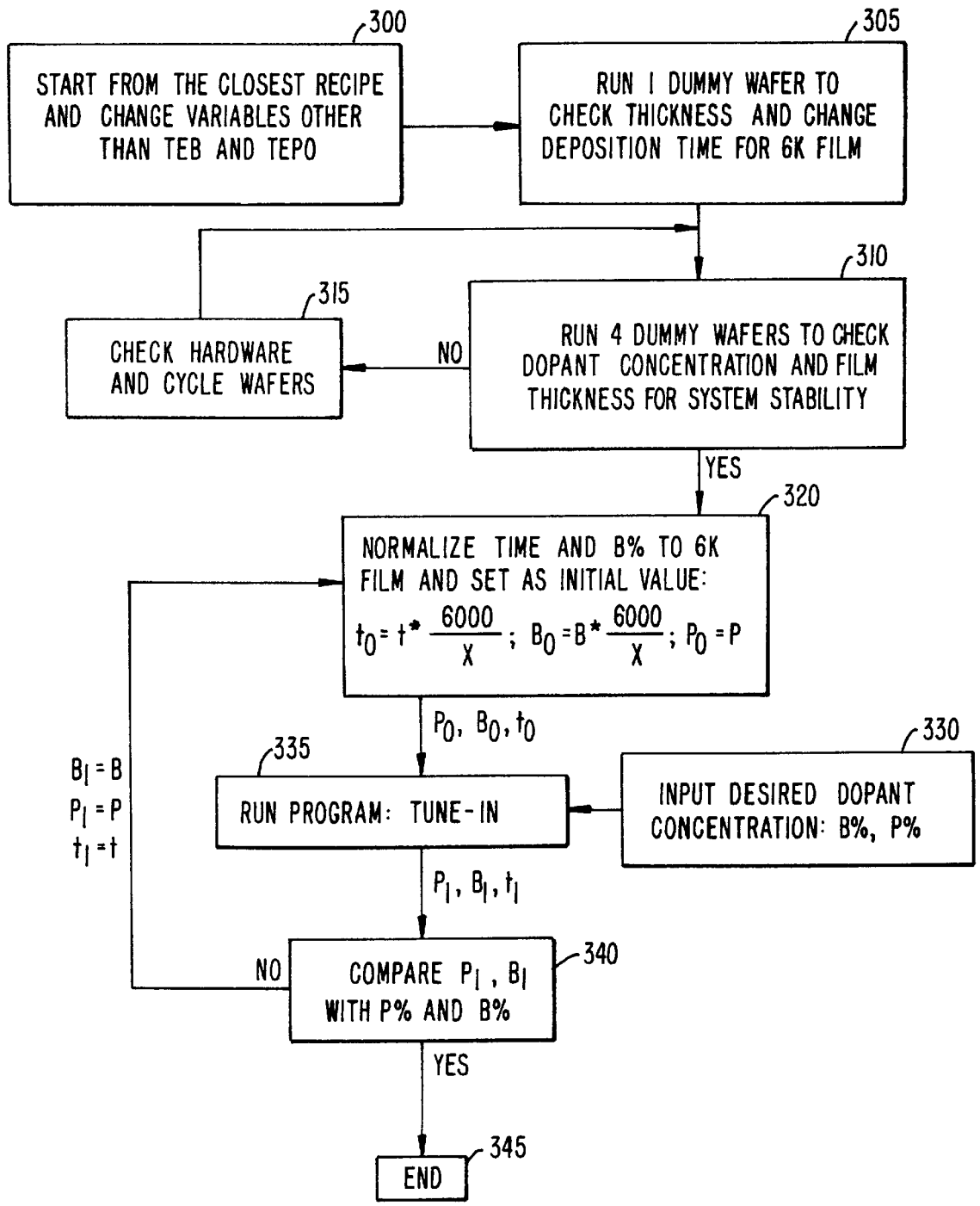
FIG. 6 is a simplified flowchart illustrating the procedure for tuning a process recipe, according to a specific embodiment of the invention.

The tuning computer program is used as part of the process tune-in procedure to obtain optimal performance from the deposition system. FIG. 6 is a simplified flowchart illustrating the procedure for tuning a process recipe, according to a specific embodiment of the invention. Preferably, the computer program should tune the process only after the deposition system has reached a stable state. As seen in FIG. 6, the tune-in procedure starts at step 300 with changing variables other than TEPO and TEB flow rates in order to optimize the process for desired characteristics. In step 300, the variables that may be changed include the TEOS, $O_3$ and carrier gas flow rates, the spacing between susceptor and manifold, the system pressure, and the temperature. The process adjustment of step 300 having been completed, a dummy wafer is deposited with a doped film in step 305 for a certain length of time. As part of step 305, the thickness of the film is measured so that the deposition time may be changed in order to deposit a film having the standard thickness. After the deposition time has been adjusted, a film is deposited on a number of wafers (e.g., 4 wafers) in step 310. After deposition of the film on each wafer, the deposited films are measured to check dopant concentration levels and film thickness to ensure that the system has reached stability. System stability is reached when the measured dopant concentrations ("B" and "P") and film thickness ("x") of each wafer in the group are consistently achieved in a given time ("t"). If the system has not yet stabilized, the system hardware is checked and wafers are cycled (step 315). Then, step 310 is repeated for another group of wafers until system stability is reached.

Once system stability is reached, the deposition time and dopant concentrations are normalized for the standard thickness and set as initial values for the computer program in step 320, as shown in FIG. 6. Specifically, the initial deposition time $t_0$ is set at 6000 t/x, and the initial boron concentration $B_0$ is set at 6000 B/x. Because XRF is not sensitive to film thickness, phosphorous concentration does not need to be normalized for the standard thickness. Then in step 320, the initial values ($t_0$, $B_0$, and $P_0$) are input to the computer program. At step 330, the equipment support engineer enters the desired target dopant concentrations B and P as inputs to the computer program. Accordingly, the computer program is run in step 335, given the inputs from steps 320 and 330. After the computer program, as described in detail in the specification, is run in step 335, the program provides final values ($t_1$, $B_1$, and $P_1$) as the output of this iteration of the computer program. In step 340, the final values of the dopant concentrations ($B_1$, and $P_1$) are compared with the target dopant concentrations entered in step 330. If the final values of the dopant concentrations ($B_1$, and $P_1$) are equal to the target dopant concentrations, then the process tune-in procedure ends in step 345 and the system is tuned for the process recipe with target dopant concentrations. If the final values of the dopant concentrations ($B_1$, and $P_1$) do not equal the target dopant concentrations, then the output values ($t_1$, $B_1$, and $P_1$) of this iteration of the computer program are normalized in step 320 to provide initial values of deposition time and dopant concentrations for the next iteration of the computer program in step 335, which uses the target dopant concentrations previously entered in step 330. Only $t_1$ and $B_1$ are normalized in step 320, as discussed above. Multiple iterations of the computer program are performed, as shown in FIG. 6, until the process tune-in is complete.

Because the tune-in is computerized and utilizes information from the process characterization, the entire process tune-in procedure is completed more rapidly and efficiently than manual tuning. The procedure with the computer program reduces the time needed to complete tuning from as long as a day down to a few hours, resulting in efficiency improvement over the manual tuning.

With its iterative nature, the computerized standard tuning process may have three possible outcomes: convergent, where each successive iteration approaches the targeted dopant concentration levels; oscillatory, where each successive iteration oscillates around the targeted dopant concentration levels without convergence; and divergent, where each successive iteration moves away from the targeted dopant concentration levels. If the standard tuning process result is non-convergent, the process cannot be tuned. Even if the result is eventually convergent, the standard tuning process may not be optimally efficient. For example, the standard tuning process, even if convergent, may take too much time if more than about 5 iterations are required.

Accordingly, in another embodiment of the invention, an in situ self-flow correction may also incorporated based on the iteration history. The incorporation of the tuning history enables the tuning process to reach convergence even more efficiently than the standard tuning process. The computer memorizes the tuning history which is incorporated into the calculation to account for the dopant flow drift, thereby eliminating the process characterization for different deposition systems. In particular, flow correction factors may be used to correct the trend curves by their incorporation into the equations discussed above. For the in-situ corrections, the assumption is made that the intrinsic dependence on dopant flow is the same for all processes, independent of hardware and time, and that any deviations are due to the actual flow control. In order to account for these deviations, two correction factors, "α" for TEPO deviations and "β" for TEB deviations, are introduced into the above equations, which may then be rewritten as the following.

$$P_1-P_0=(TEPO_1-TEPO_0)*\alpha*k_{12}+(TEB_1-TEB_0)*\beta*k_{22}$$

$$B_1-B_0=(TEPO_1-TEPO_0)*\alpha*k_{13}+(TEB_1-TEB_0)*\beta*k_{23}$$

$$DR_1=6000/t_1=DR_0+(TEPO_1-TEPO_0)*\alpha*k_{11}+(TEB_1-TEB_0)*\beta*k_{21}$$

$$=6000/t_0+(TEPO_1-TEPO_0)*\alpha*k_{11}+(TEB_1-TEB_0)*\beta*k_{21}$$

Accordingly, the flow correction factors may be calculated with the following equations by using the previous iteration results ($B_1$, and $P_1$) memorized by the computer and inputting the current iteration results ($B_2$, and $P_2$).

$$\alpha=[(P_1-P_2)*k_{23}-(B_1-B_2)*k_{22}]/[(k_{12}*k_{23}-k_{13}*k_{22})(TEPO_1-TEPO_2)]$$

$$\beta=[-(P_1-P_2)*k_{13}+(B_1-B_2)*k_{12}]/[(k_{12}*k_{23}-k_{13}*k_{22})(TEB_1-TEB_2)]$$

Of course, for tune-in iterations for which flow corrections are not accounted, $\alpha=1$ and $\beta=1$. The embodiment discussed above for FIG. 6 preferably incorporates the above correction factors. Flow correction factors, along with the dopant flow rates, are updated with each iteration of the tune-in, thereby forcing the tune-in process to become convergent. The flow corrections are applicable to the range of dopant concentrations that are close to the target dopant concentrations. Further, it is recognized that different target dopant concentrations may have different correction factors. Accordingly, different memory files may be used for the correction factors of different target dopant concentrations.

Figure 7:
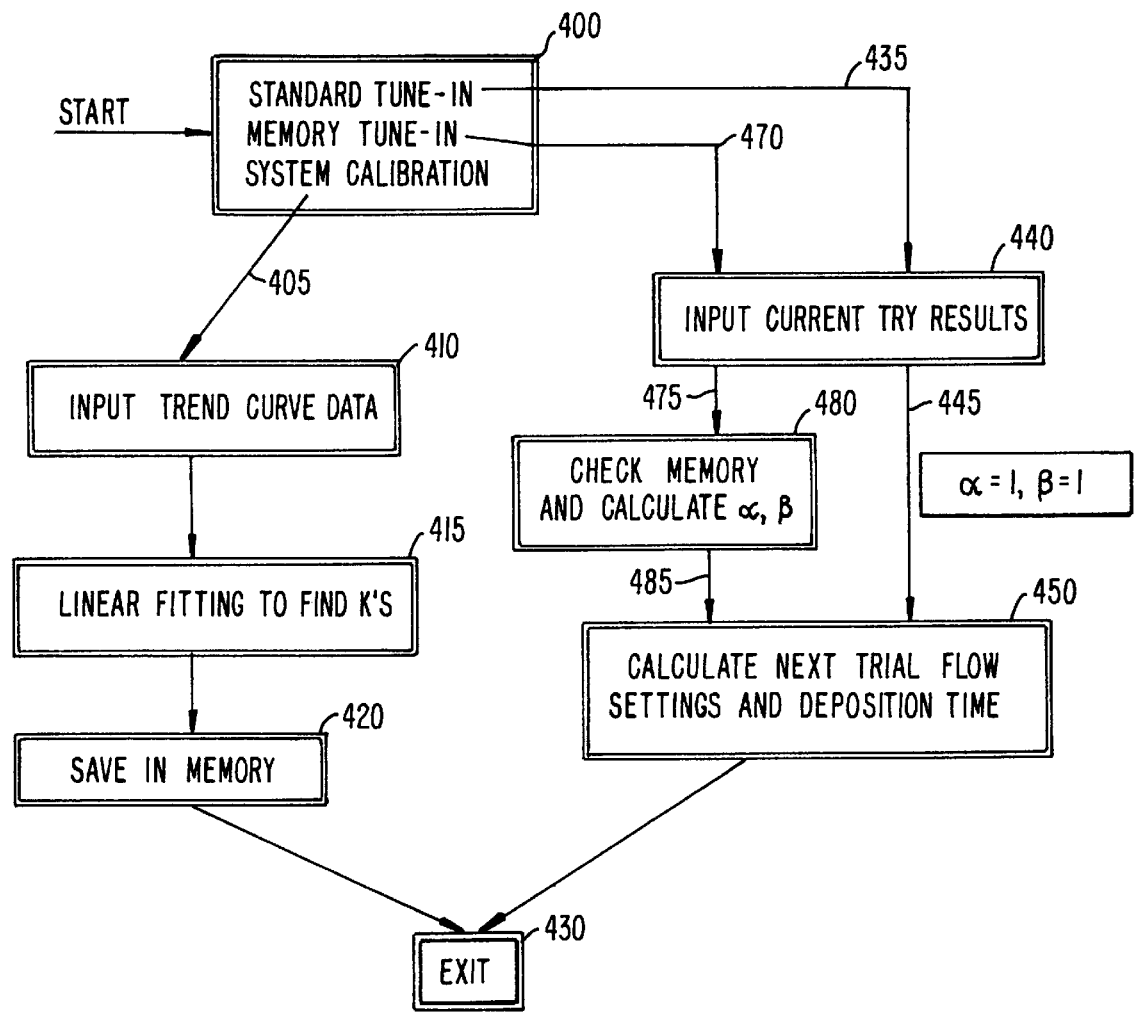
FIG. 7 is a simplified diagram illustrating the structure of the computer program, according to another embodiment of the invention.

FIG. 7 is a simplified diagram illustrating the general structure of the computer program, according to another embodiment of the invention. The computer program of the present embodiment has the capability of performing a system calibration process, a standard tune-in process, and a memory tune-in process, as seen in step 400 where the user may select any of these capabilities.

Upon selection of the system calibration process as indicated by line 405, the computer program in step 410 prompts the user to input trend curve data. As discussed above, the trend curve data input consists of data on dopant flow rates, deposition rates, and dopant concentrations needed for process characterization. The computer program then proceeds to perform a linear fitting of the input data in order to calculate the constants (e.g., $k_{11}$, $k_{21}$, etc.), in accordance with a specific embodiment. Thus, the process characterization data is easily updated by the computer program, according to a specific embodiment. In step 420, the computer program saves the constants from step 415 in a memory file in memory 38. This memory file is associated with the specific dopant concentrations that were targeted. Then the computer program exits the system calibration process in step 430. System calibration accounts for the differences in results obtained with different individual deposition systems. Moreover, a system calibration should be performed after any hardware modifications to the system or after replacement parts, including in particular the flow control valves, have been installed in the system. Accordingly, for maximum efficiency, a system calibration should be performed prior to performance of a standard tune-in process or a memory tune-in process. The results obtained using the present embodiment of the invention thus do not depend on the individual deposition systems, which might otherwise provide variable results even for the identical tuning process.

The standard tune-in process is similar to the process described above in relation to FIG. 6. Upon selection of the standard tune-in process as indicated by line 435 in FIG. 7, the computer program proceeds through the tune-in iteration (as described by steps 320, 330, and 335 of FIG. 6) and then inputs the current iteration results ($t_1$, $B_1$, and $P_1$) in step 440. As indicated by line 445, the computer program goes from step 440 to calculation step 450. In the present embodiment, flow deviations are not accounted for, and thus both correction factors $\alpha$ and $\beta$ are set equal to 1. In step 450, the next trial flow settings and deposition time are calculated. Then the computer program proceeds from step 450 to exit in step 430.

The present embodiment also includes a memory tune-in process that incorporates the tuning history to account for dopant flow deviation or drift in the system. Upon selection of the memory tune-in process, as indicated by line 470, in the first iteration the computer program proceeds through the tune-in iteration (as described by steps 320, 330, and 335 of FIG. 6) and then inputs the current iteration results ($t_1$, $B_1$, and $P_1$) in step 440. As indicated by line 475, the computer program proceeds (indicated by line 475) from step 440 to step 480. In step 480, the computer program checks the memory for the past iteration results and calculates correction factors $\alpha$ and $\beta$, as discussed above. The computer program then goes to step 450, as indicated by line 485. In step 450, the next iteration flow settings and deposition time are calculated. Then the computer program proceeds to exit in step 430. Flow correction factors, along with the dopant flow rates, are updated with each iteration of the tune-in, thereby forcing the tune-in process to become convergent.

It is to be understood that the above description is intended to be illustrative and not restrictive. Many embodiments will be apparent to those of skill in the art upon reviewing the above description. By way of example the inventions herein have been illustrated primarily with regard to a TEOS/$O_3$ BPSG process recipe, but they are not so limited. For example, the BPSG film may be deposited using a chemistry other than TEOS/$O_3$. As another example, the BPSG film may be deposited using different combinations of other dopant sources besides TEB and TEPO. As yet another example, the doped film formed according to other embodiments may be a different type of film than BPSG. Those skilled in the art will recognize other equivalent or alternative methods of depositing the dielectric layer while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. A method for tuning a process of forming a doped film over a substrate in a deposition system, said method comprising:
   (1) setting a target dopant concentration for the doped film and starting dopant flow rates;
   (2) determining a dopant concentration using said starting dopant flow rates and characterization data of the process;
   (3) comparing said dopant concentration with said target dopant concentration;
   (4) if said dopant concentration is not substantially equal to said target dopant concentration, calculating updated dopant flow rates using said dopant concentration and characterization data of the process, determining an updated dopant concentration using said updated dopant flow rates and characterization data of the process, and comparing said updated dopant concentration with said target dopant concentration;
   (5) if said updated dopant concentration is not substantially equal to said target dopant concentration, resetting said updated dopant flow rates as starting dopant flow rates and repeating step (4) until said updated dopant concentration is substantially equal to said target dopant concentration, and setting said updated dopant flow rates as actual dopant flow rates; and (6) depositing the doped film over the substrate using said actual dopant flow rates.

2. The method of claim 1 wherein said characterization data includes dopant flow correction factors to account for dopant flow drift.

3. The method of claim 1 wherein said step (4) further comprises computing updated characterization data using said dopant concentration, said updated dopant concentration, said starting dopant flow rates, and said updated dopant flow rates; and wherein said step (5) further comprises resetting said updated characterization data as characterization data for use in said step (4) to improve convergence to said actual dopant flow rates.

4. The method of claim 1 wherein said characterization data comprises linear relationships between changes in dopant flow rates and corresponding changes in dopant concentrations.

5. The method of claim 1 further comprising, prior to said step (2), the step of calibrating the system to obtain said characterization data of the process.

6. The method of claim 5 wherein said step of calibrating the system comprises linear fitting input data of the process including input dopant flow rates and input dopant concentrations to obtain the characterization data of the process.

7. The method of claim 1 wherein the process comprises a borophosphosilicate glass (BPSG) process.

8. The method of claim 7 wherein the process is a TEOS/$O_3$ BPSG process.

9. The method of claim 7 wherein said dopant flow rates include TEB flow rates.

10. The method of claim 7 wherein said dopant flow rates include TEPO flow rates.

11. The method of claim 8 wherein said dopant flow rates further include TEPO flow rates.

12. A product formed by the process tuned by the method of claim 1.

13. A product formed by the process tuned by the method of claim 11.

14. A computer program product for tuning a process recipe for targeted dopant concentrations in a doped film, said computer program product comprising:

computer readable code defining a process of receiving as input a target dopant concentration and starting dopant flow rates;

computer readable code defining a process of determining a dopant concentration using said starting dopant flow rates and process characterization data;

computer readable code defining a process of comparing said dopant concentration with said target dopant concentration;

computer readable code defining a process, if said dopant concentration is not substantially equal to said target dopant concentration, of calculating updated dopant flow rates using said dopant concentration and process characterization data, determining an updated dopant concentration using said updated dopant flow rates and process characterization data, and comparing said updated dopant concentration with said target dopant concentration;

computer readable code defining a process, if said updated dopant concentration is not substantially equal to said target dopant concentration, of resetting said updated dopant flow rates as starting dopant flow rates and repeating said steps of calculating updated dopant flow rates, determining an updated dopant concentration, and comparing said updated dopant concentration until said updated dopant concentration is substantially equal to said target dopant concentration, and of setting said updated dopant flow rates as actual dopant flow rates; and a tangible medium that stores the computer readable codes.

15. The computer program product of claim 14, wherein said characterization data includes dopant flow correction factors.

16. The computer program product of claim 14, wherein said tangible medium is selected from a group consisting of CD-ROM, tape, floppy disk, and the like.

17. A substrate processing apparatus comprising:

a processing chamber;

a gas delivery system configured to deliver a process gas to said processing chamber, said process gas including sources of dopants;

a heating system configured to heat said chamber to a selected temperature;

a controller configured to control said gas delivery system and said heating system;

a first computer program product, coupled to said controller, comprising a computer-readable medium storing a computer-readable program for directing the operation of said substrate processing apparatus, said program including a first set of instructions to form a doped film on said substrate from said process gas, said first set of instructions including a first subset of instructions for controlling said gas delivery system to introduce said sources of dopants into said chamber at selected first rates of introduction during a first time period; and a second computer program product, coupled to said controller, comprising a computer-readable medium storing a tuning program for tuning the operation of said substrate processing apparatus to converge to target dopant concentrations in the doped film, said tuning program receiving as inputs the target dopant concentrations and the first rates of introduction to produce second rates of introduction during a second time period based on process characterization equations for use by said program.

18. The apparatus of claim 17 wherein said second computer program product also stores a system calibration program for inputting process characterization data and formulating equations therefrom.

19. The apparatus of claim 17 wherein said tuning program uses dopant flow correction factors to produce said second rates of introduction during the second time period based on process characterization equations.

20. The apparatus of claim 17 further comprising a vacuum system configured to set and maintain a selected pressure within said chamber, wherein said controller is also configured to control said vacuum system; and wherein said first set of instructions further comprises a second subset of instructions for controlling said vacuum system to set and maintain said chamber at a pressure of between about 10–760 torr during said first and second time periods.

21. The apparatus of claim 17 wherein said process gas includes TEOS and $O_3$.

22. The apparatus of claim 17 wherein said dopants include boron from TEB.

23. The apparatus of claim 17 wherein said dopants include phosphorus from TEPO.

24. The apparatus of claim 21 wherein said dopants include boron from TEB and phosphorus from TEPO.

* * * * *